United States Patent
Su et al.

(10) Patent No.: US 10,729,027 B2
(45) Date of Patent: Jul. 28, 2020

(54) METHOD AND STRUCTURE FOR LIMITING COVER DEFLECTION IN AN ECU WITH LEAKAGE TESTING FEATURE

(71) Applicant: Continental Automotive Systems, Inc., Auburn Hills, MI (US)

(72) Inventors: Patrick Su, Shelby Township, MI (US); Kevin D Moore, Bloomfield Hills, MI (US); Ravi Kiran Kothamasa, Lake Orion, MI (US); Leonardo Ramon Haoava Salazar, Tlajomulco de Zuniga (MX)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 0 days.

(21) Appl. No.: 16/183,857

(22) Filed: Nov. 8, 2018

(65) Prior Publication Data

US 2020/0154588 A1 May 14, 2020

(51) Int. Cl.
*H05K 5/00* (2006.01)
*H05K 5/06* (2006.01)
*H05K 7/14* (2006.01)
*H05K 5/03* (2006.01)

(52) U.S. Cl.
CPC ........... *H05K 5/069* (2013.01); *H05K 5/0004* (2013.01); *H05K 5/0017* (2013.01); *H05K 5/03* (2013.01); *H05K 7/1427* (2013.01)

(58) Field of Classification Search
CPC ........ H05K 5/069; H05K 5/03; H05K 7/1427; H05K 5/0004; H05K 5/0017; H05K 5/0052; H05K 5/0213; Y10T 403/25
See application file for complete search history.

(56) References Cited

U.S. PATENT DOCUMENTS

2007/0109730 A1* 5/2007 Shigyo ................. H05K 5/0052
361/600
2015/0138738 A1* 5/2015 Kothamasa .......... H05K 5/0052
361/752

* cited by examiner

Primary Examiner — James Wu (57) ABSTRACT

An engine control unit (ECU) includes a housing; a cover sealingly engaged with the housing so as to define an interior space; a circuit board disposed in the interior space; and a fastener coupling together the circuit board, the housing and the cover, the fastener serving to limit an amount of deflection of the housing relative to the housing. The circuit board and the cover are constructed and arranged to define an airflow path from an outer surface of the cover to the interior space. The airflow path allows for a leak test to be performed on the ECU, wherein upon an affirmative determination that results of the leak test shows no leaks in the ECU, sealant seals the airflow path.

17 Claims, 7 Drawing Sheets

METHOD AND STRUCTURE FOR LIMITING COVER DEFLECTION IN AN ECU WITH LEAKAGE TESTING FEATURE

FIELD

The invention relates to a sealed engine control unit (ECU) for automotive vehicles and, more particularly, to support structure for limiting deflection of a cover of the sealed ECU in high altitude environments while providing for a leak testing feature.

BACKGROUND

ECUs are control units typically installed in the engine compartment of a vehicle. The ECU typically controls many of the functions of the vehicle such as the fuel injector drivers, engine operations, etc., by controlling a series of actuators based on input from sensors.

Typical ECUs have a circuit board that is disposed in a housing. A cover, mounted to the housing, covers the circuit board. When a vehicle and thus the ECU are exposed to high altitudes, internal pressure can build up inside the ECU. In a sealed ECU where the cover is sealed with respect to the housing, such internal pressure may cause the cover to deflect outwardly, reducing the effectiveness of the sealing arrangement. Using a vent in the ECU could equalize the pressure inside the ECU, but this solution cannot be used when customer's demands a sealed ECU. Cover deflection can be limited by using a cast cover. However, a cast cover is expensive and very heavy.

Thus, there is a need in a sealed ECU to limit, in a cost-effective manner, deflection of the cover when internal pressure increases inside of the ECU.

SUMMARY

In accordance with the principles of an embodiment, there is provided an ECU that includes a housing; a cover sealingly engaged with the housing so as to define an interior space; a circuit board disposed in the interior space; and a fastener coupling together the circuit board, the housing and the cover, the fastener serving to limit an amount of deflection of the housing relative to the housing. The circuit board and the cover are constructed and arranged to define an airflow path from an outer surface of the cover to the interior space.

The cover may be composed of stamped metal.

In example embodiments, each of the cover and the circuit board includes a slot, and the airflow path passes through the slots. Each slot is sized and dimensioned so that the fastener is inserted therethrough, the fastener includes a head, and a portion of each slot extends beyond the head of the fastener. The airflow path is defined through the portion of each slot.

In example embodiments, the cover includes a recess, the slot of the cover being defined in the recess. The slot of the circuit board is disposed adjacent the slot of the cover.

The ECU may further include an adhesive-backed label disposed along the cover and covering the recess.

The portion of each slot extends beyond the head of the fastener in opposite directions therefrom.

The ECU may further include sealant material disposed over and around the fastener and covering the slot of the cover so as to provide a seal with the cover.

Each of the cover and the circuit board includes a slot, the airflow path passes through the slots, and the ECU further includes sealant material disposed over and around the fastener and covering the slot of the cover such that the sealant and the cover seals the airflow path.

In another example embodiment, an electronics device includes a circuit board having one or more electrical components disposed thereon, the circuit board including a slot defined therethrough; a housing in or on which the circuit board is disposed; a cover covering the circuit board and connected to the housing, the cover including a slot defined therethrough, the cover and the housing defining an interior space in which the circuit board is disposed; and a fastener attaching together the cover, the circuit board and the housing and limiting an amount of deflection of the cover relative to the housing. The fastener, the slot of the circuit board and the slot of the cover are configured to define an airflow path between the interior space and an outer surface of the cover.

In an example embodiment, each slot is sized and dimensioned so that the fastener is inserted therethrough, the fastener includes a head, a portion of each slot extends beyond the head of the fastener, and the airflow path is defined through the portion of each slot. The cover may include a recess, the slot of the cover being defined in the recess.

The slot of the circuit board may be disposed adjacent the slot of the cover, and the portion of each slot extends beyond the head of the fastener in opposite directions therefrom. The electronics device may further include an adhesive-backed label disposed along the cover and covering the recess.

A sealant material is disposed over and around the fastener and covering the slot of the cover so as to provide a seal with the cover.

Each of the cover and the circuit board includes a slot, the airflow path passes through the slots, and the ECU further includes sealant material disposed over and around the fastener and covering the slot of the cover such that the sealant and the cover seals the airflow path.

An assembly method for an electronics device may include, according to an example embodiment, providing a circuit board having a slot defined therethrough, a housing, a cover having a slot defined therethrough, and a fastener; disposing the circuit board over or in the housing, placing the cover over the circuit board so that the circuit board is disposed within an interior spaced formed by the cover and the housing, and engaging the cover with the housing; inserting a fastener through the slot of the cover and the slot of the circuit board and securing the fastener to the housing, an airflow path being defined between the interior space and an outer surface of the cover through the slot of the circuit board and the slot of the cover; performing a leak test on the electronics device using the airflow path; and determining whether results of the leak test indicate an absence of air leaks in the electronics device. Upon an affirmative determination of the absence of air leaks, the method includes sealing the airflow path with a sealant.

The cover includes a recess in which the slot of the cover is defined, the fastener is disposed in the recess, and the method further includes placing an adhesive-backed label over at least a portion of the cover, covering the recess.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION

Figure 1:
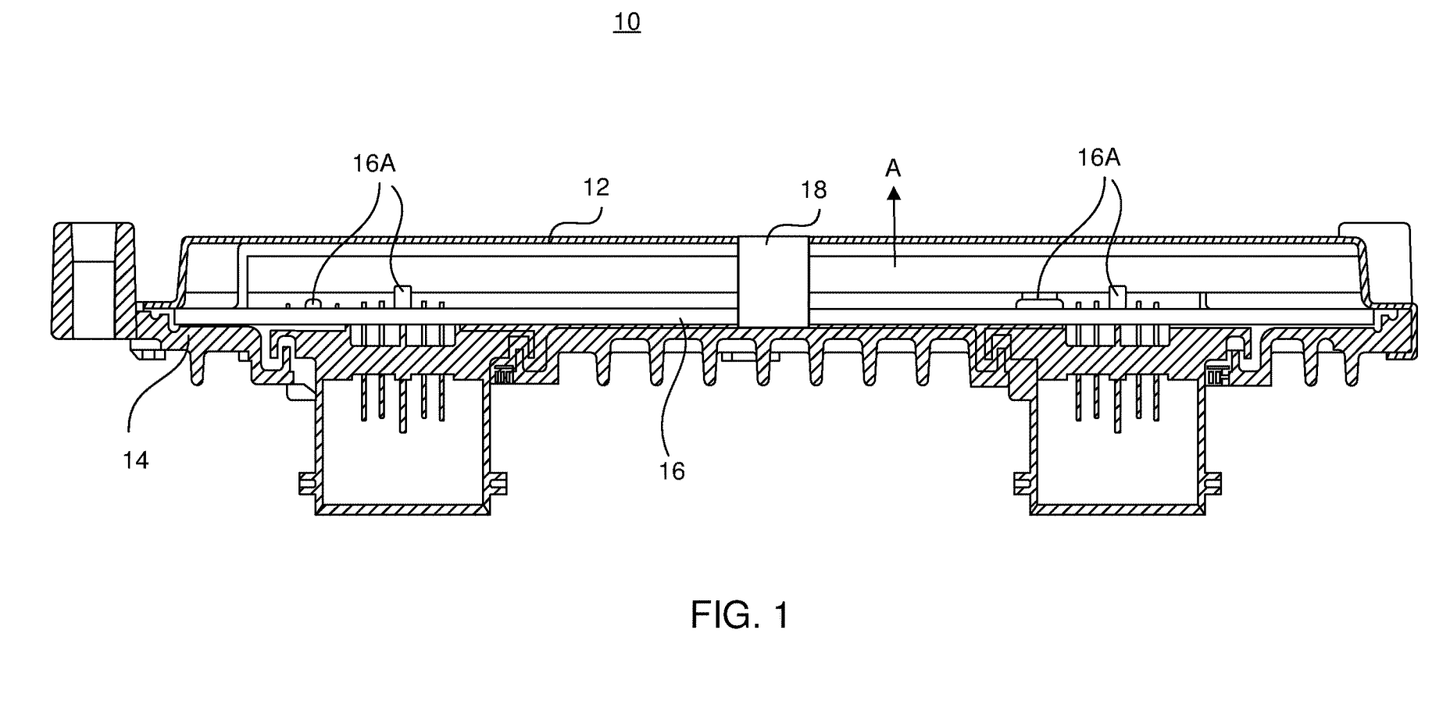
FIG. 1 side cross sectional view of an ECU in accordance with an embodiment.

With reference to FIG. 1, an ECU is shown, generally indicated at 10, for controlling operations of a vehicle. The ECU 10 has a cover 12 secured to a housing 14. The ECU 10 includes a circuit board 16 mounted to the housing 14 by one or more fasteners. In an example embodiment, the circuit board 16 is a printed circuit board. The cover 12, preferably of stamped metal such as steel or aluminum, is engaged with the housing 14 in a sealed manner so as to protect the circuit board 16 by preventing the intrusion of moisture and/or foreign particles into the housing 14. Thus, a conventional sealing arrangement (not shown) is provided between the cover 12 and the housing 14.

Figure 2A:
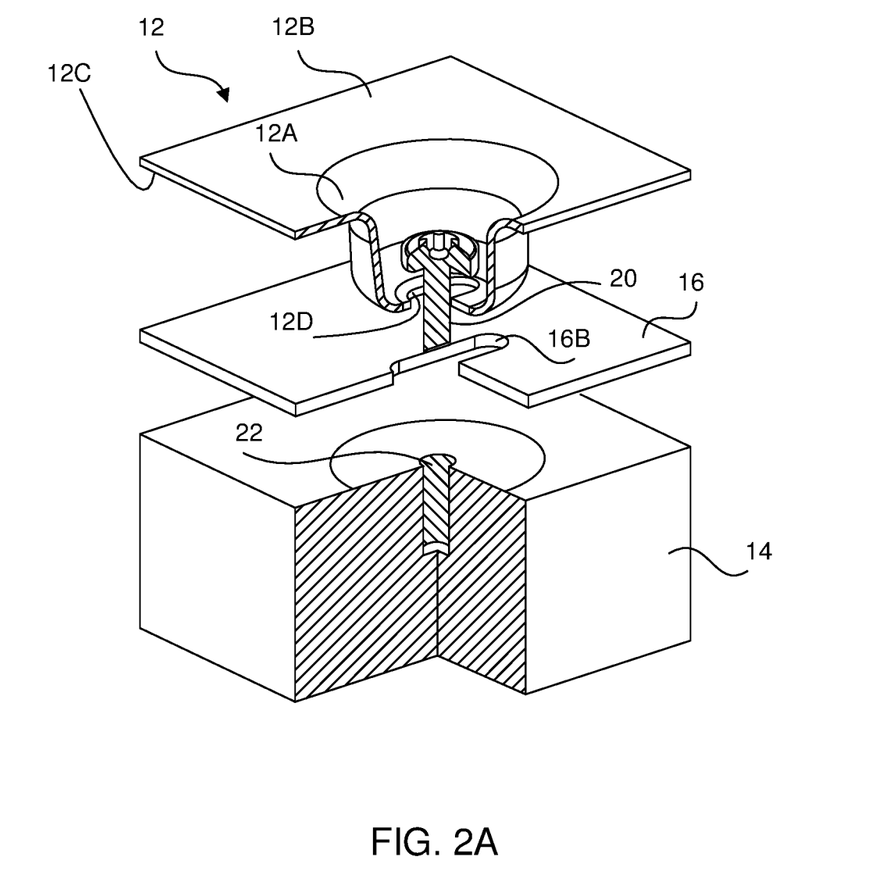
FIG. 2A is a cross-sectional, exploded perspective view of a portion of the ECU of FIG. 1, showing an embodiment of a support structure of the ECU according to an example embodiment.
Figure 2B:
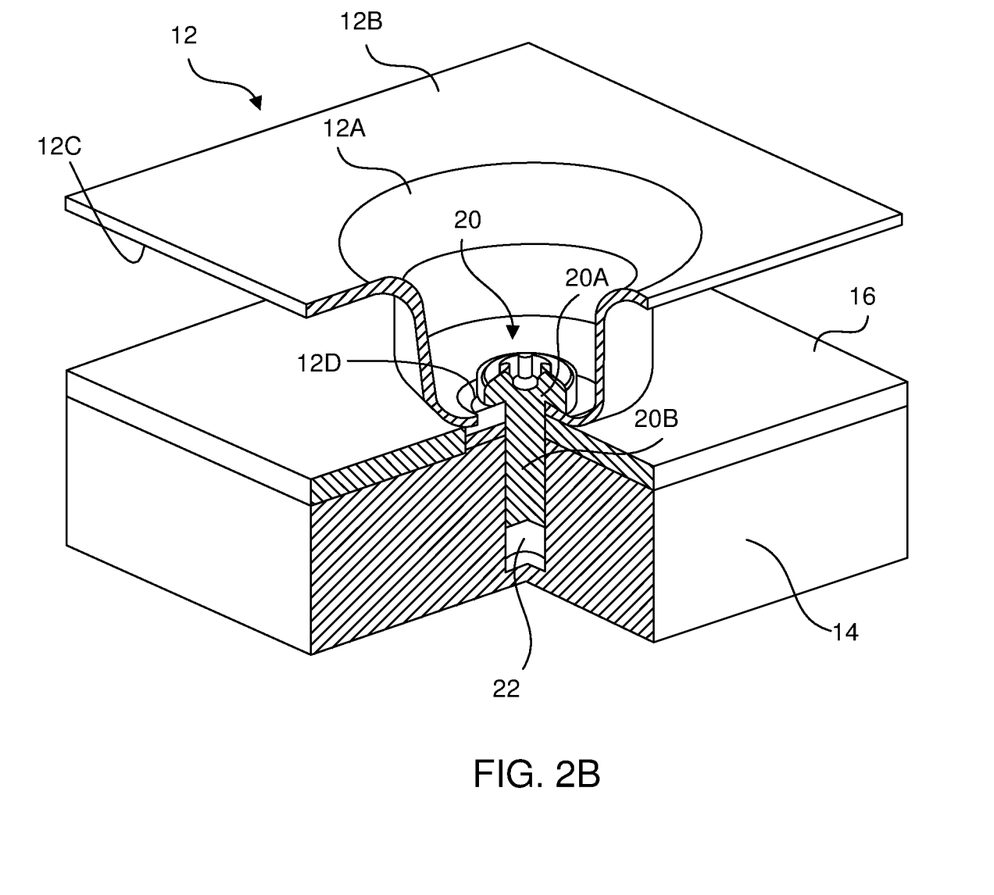
FIG. 2B is a cross-sectional, perspective view of the portion of the ECU, showing the embodiment of the support structure of the ECU according to an example embodiment.

The circuit board 16 is populated with one or more electrical components 16A, such as discrete electrical components and integrated circuits, disposed along at least one surface of the circuit board 16. For the ECU 10, the electrical components 16A may include one or more controllers or processors with memory communicatively coupled thereto. The circuit board 16 includes one or more metal layers for providing electrical connections between the electrical components 16A as well as providing electrical connections to and from the electrical components 16A, as is well known in the art. The circuit board 16 may be formed from laminated layers of conductive and non-conductive material for providing the electrical connections, as is also well known in the art. As shown in FIGS. 2A and 2B, defined through the circuit board 16 is an elongated slot 16B.

Since the ECU 10 is a sealed unit, when a vehicle employing the ECU 10 is exposed to high altitudes, internal pressure can build up inside the ECU 10, causing the cover 12 to deflect outwardly (in the direction of arrow A in FIG. 1), reducing the effectiveness of the sealing arrangement. Thus, to provide rigidity to the cover 12, in accordance with example embodiments, a support structure 18 is associated with the cover 12. The support structure 18 is adapted to fixedly attach the cover 12 to the housing 14. The support structure 18 may be centrally located along the cover 12 and the housing 14 but it is understood that the support structure 18 may be disposed in other locations along the cover 12 and the housing 14.

Figure 3:
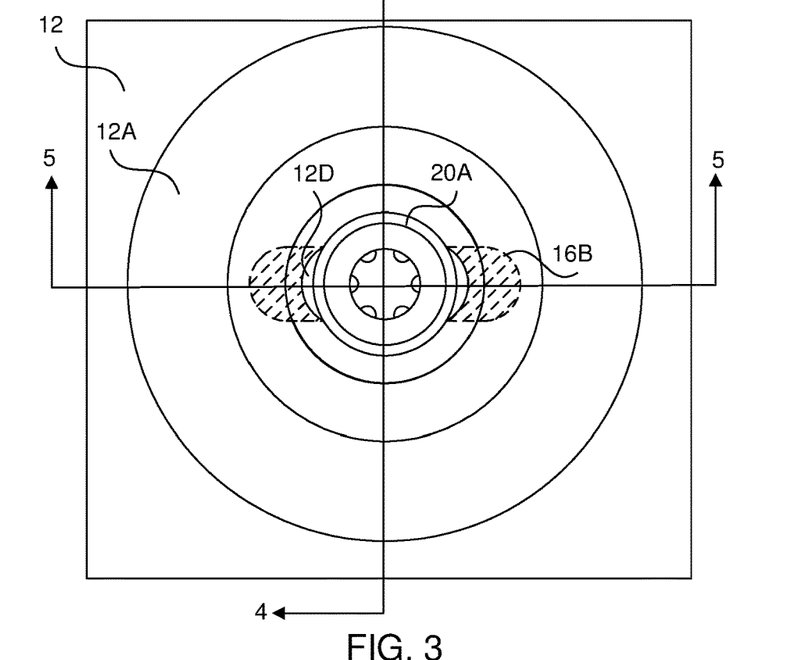
FIG. 3 is a top view of the support structure of FIGS. 2A and 2B.
Figure 4:
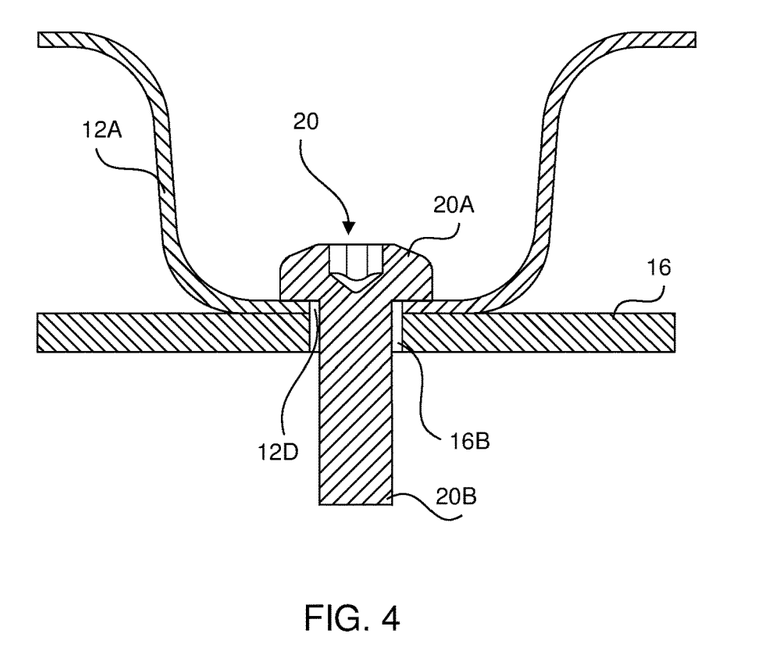
FIG. 4 is a cross-sectional view of the support structure taken along the 4-4 line of FIG. 3.
Figure 5:
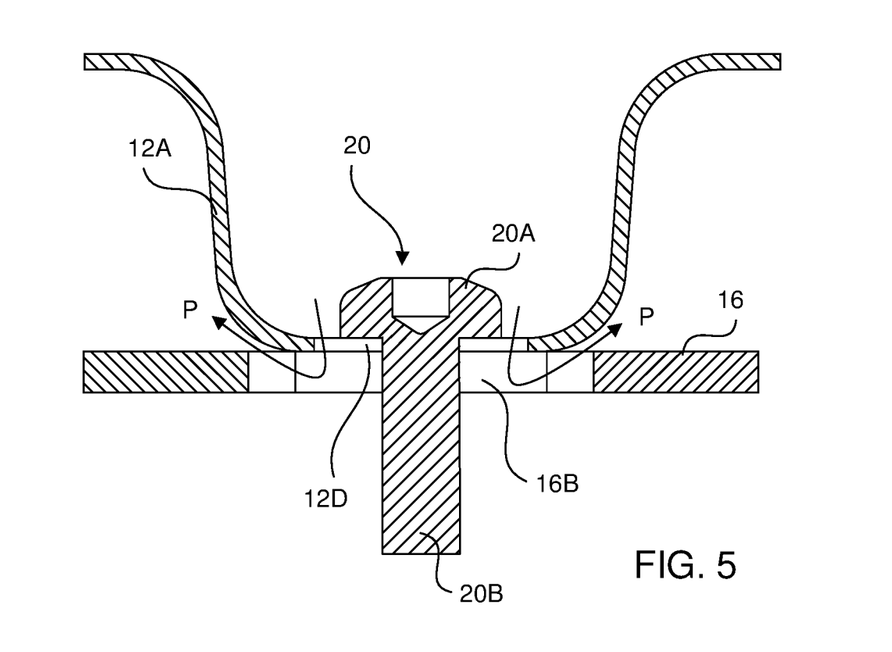
FIG. 5 is a cross-sectional view of the support structure taken along the line 5-5 of FIG. 3.

As shown in FIG. 1, cover 12 is largely planar having a major surface that is parallel to the circuit board 16 and side surfaces which extend generally orthogonally from ends of the major surface. In an example embodiment illustrated in the drawings, the support structure 18 includes a recess 12A defined in the cover 12, as shown in FIGS. 2A-2B and 3-7. The recess 12A provides a concave portion along an outer surface 12B and a convex portion along an inner surface 12C. The depth of the recess 12A may be based upon a desired amount of spacing between the circuit board 16 and the cover 12, a desired amount of spacing between the components 16A disposed along the circuit board 16 and the cover 12, or both spacing amounts. A base or bottom of recess 12A is largely flat. Best seen in FIGS. 2A and 3-7, an elongated slot 12D is defined through the base of the recess 12A. In the illustrated example embodiment, the slot 12D of the cover 12 is disposed over and aligned with the slot 16B of the circuit board 16. The slot 16B of the circuit board 16 may be longer than the slot 12D of the cover 12, as best seen in FIG. 3. The length of the slot 12D of the cover 12 is less than a diameter of the recess 12A at the base or lowermost portion thereof.

The support structure 18 further includes a fastener 20, which may be a screw, bolt or the like. The fastener 20 fixedly attaches the cover 12 to the housing 14. The fastener 20 is provided through the slots 12D and 16B of the cover 12 and the circuit board 16, respectively, and extends into a bore 22 defined in the housing 14 (FIGS. 2A-2B). The fastener 20 preferably has a head 20A and a threaded portion 20B which engages with the housing 14. In the embodiment in which the fastener 20 is a bolt, the threaded portion 20B engages with threads defined in the bore 22.

With the fastener 20 engaged with the bore 22 of the housing 14 and tightened thereto, the cover 12 and the circuit board 16 are secured to the housing 14, thereby preventing outward deflection of the cover 12 from the housing 14 in the direction A (FIG. 1).

In the example embodiments, the slot 12D of the cover 12 and the slot 16B of the circuit board 16 provide for an airflow path P between the interior of the ECU 10 and the exterior thereto. Best seen in FIG. 5, the airflow path P passes through the slots 12D and 16B of the cover 12 and the circuit board 16, respectively. In particular, the length of each of the slots 12D and 16B is greater than a diameter of the head 20A of the fastener 20 so that the airflow path P is able to extend between the interior of the ECU 10 and the exterior thereof.

The presence of the airflow path P allows for the ECU 10 to be capable of having leak testing performed thereon. In general terms, leak testing is a test to determine the seal integrity of a sealed housing and is typically performed by pressurizing the interior of the housing with a gas, such as air, a helium-based gas or the like, for a period of time, placing the housing under vacuum and monitoring gas that leaks out of the housing. Leak testing may include both gross leak testing and fine leak testing. For performing a leak test on the ECU 10, the airflow path P is used to provide gas under pressure to the interior of the ECU 10, from which gas exiting the interior is monitored. In this way, the airflow path P allows for leak testing to be performed to identify leak locations in the ECU 10.

Figure 6:
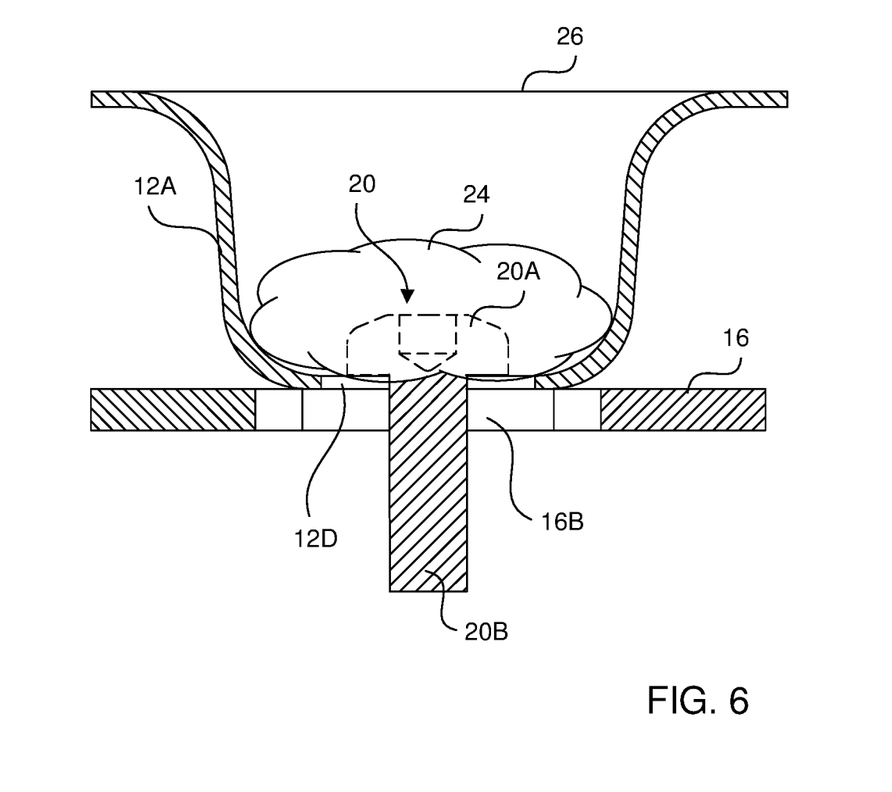
FIG. 6 is a cross-sectional view of the support structure taken along the line 5-5 of FIG. 3 with a sealant added thereto.
Figure 7:
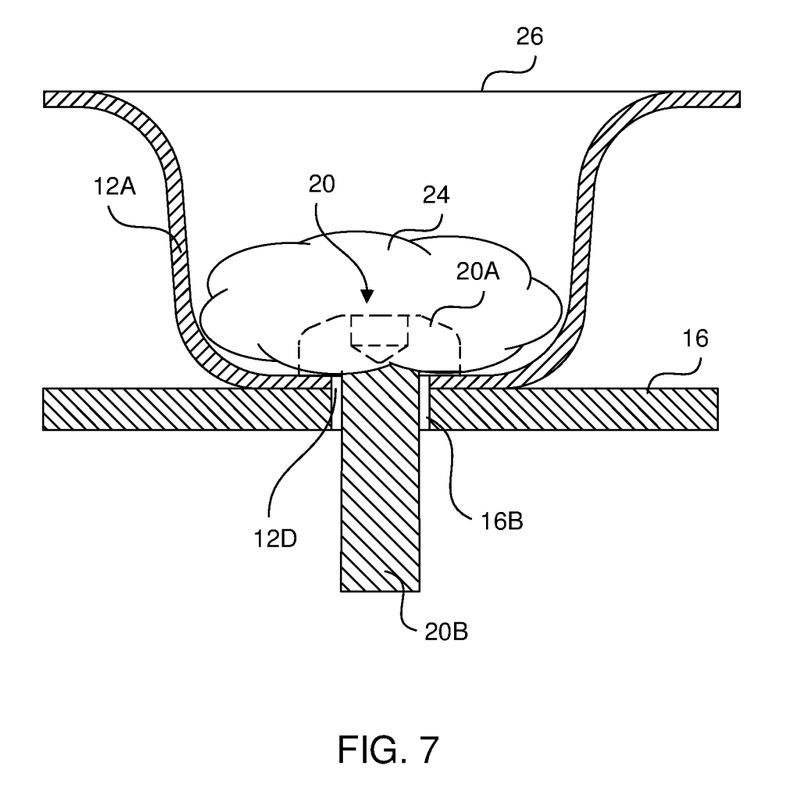
FIG. 7 is a cross-sectional view of the support structure taken along the line 4-4 of FIG. 3 with the sealant added.

Once the leak test(s) is complete, the airflow path P is sealed. In an example embodiment, a sealant 24 is placed within the recess 12A of the cover 12 so as to seal the opening of the airflow path P between the head 20A of fastener 20 and the inner walls of the recess 12A. The sealant 24 may be any of a number of known materials used to provide a seal with metal. FIGS. 6 and 7 illustrate the sealant 24 disposed in the recess 12A, sealing the airflow path P. Once the airflow path P is sealed with the sealant 24, an adhesive-backed label or sticker 26 is placed on the cover 12 so as to cover the recess 12A. The label 26 may include printed content on its exposed surface to, for example, identify the ECU 10, its assembly date, etc.

The support structure 18 limits deflection of the cover 12 to prevent permanent deformation of the cover 12 and also avoids any disturbance of the sealing arrangement between the cover 12 and the housing 14, thereby preventing failure of the ECU due to leaks. The support structure 18 does not significantly increase the weight of the ECU and is less expensive than other solutions.

Figure 8:
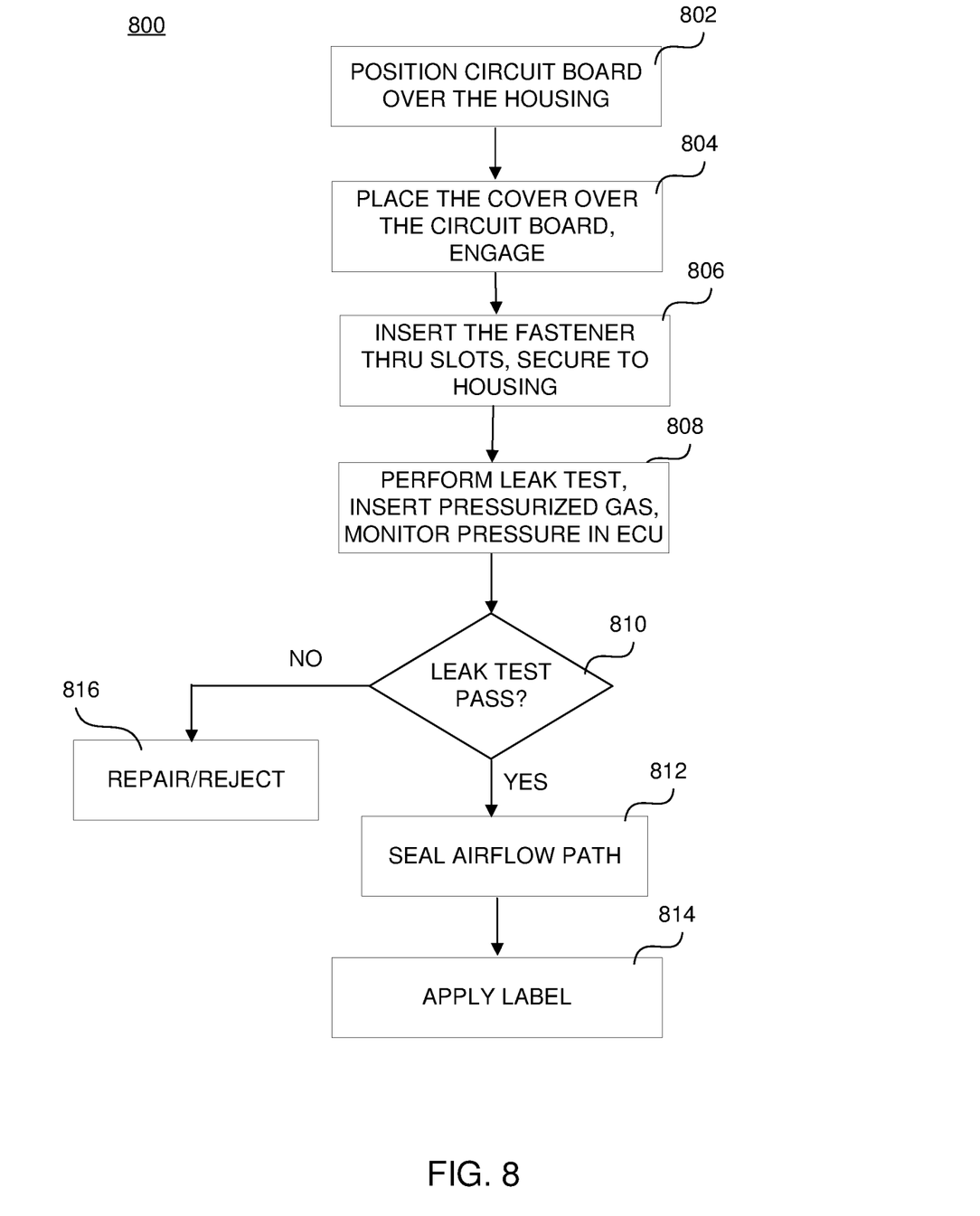
FIG. 8 is a flowchart illustrating the assembly or manufacture of an ECU according to an example embodiment.

With reference to FIG. 8, an assembly and/or manufacturing method 800 for the ECU 10 is shown including the steps of positioning at 802 the circuit board 16 over or in the housing 14 and securing the circuit board thereto; placing at 804 the cover 12 over the circuit board 16 so that the circuit board 16 is disposed within an interior spaced formed by the cover 12 and the housing 14, and sealingly engaging the cover 12 with the housing 14. The method further includes inserting at 806 the fastener 20 through the slot 12D of the cover 12 and the slot 16B of the circuit board 16, and securing the fastener 20 to the housing 14. With the airflow path P being defined between the interior space and an outer surface of the cover 12, through the slot 16B of the circuit board 16 and the slot 12D of the cover 12, a leak test at 808 is performed on the ECU 10 using the airflow path P for inserting a gas under pressure into the ECU interior space and monitoring the pressure therein. The method further includes determining at 810 whether results of the leak test indicate an absence of air leaks in the ECU 10. Upon an affirmative determination, the airflow path is sealed with the sealant 24 at 812. The method then includes placing at 814 the adhesive-backed label 26 over at least a portion of the cover 12, covering the recess 12A. If the results of the leak test show the existence of a leak in the tested ECU 10, then the ECU may at 816 be repaired or rejected.

The support structure 18 is described above as being part of the ECU 10. It is understood that the support structure 18 is not limited to an ECU and may instead be used in virtually any electronics device having a sealed housing which may be susceptible to deformation due to temperature and/or pressure conditions.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. An engine control unit (ECU) comprising:
    a housing;
    a cover sealingly engaged with the housing so as to define an interior space;
    a circuit board disposed in the interior space; and
    a fastener coupling together the circuit board, the housing and the cover, the fastener serving to limit an amount of deflection of the cover relative to the housing,
    wherein the circuit board and the cover are constructed and arranged to define an airflow path from an outer surface of the cover to the interior space,
    wherein each of the cover and the circuit board includes a slot, and the airflow path passes through the slots, and
    wherein each slot is sized and dimensioned so that the fastener is inserted therethrough, the fastener includes a head, and a portion of each slot extends beyond the head of the fastener.

2. The ECU of claim 1, wherein the cover is composed of stamped metal.

3. The ECU of claim 1, wherein the airflow path is defined through the portion of each slot.

4. The ECU of claim 3, wherein the cover includes a recess, the slot of the cover being defined in the recess.

5. The ECU of claim 4, wherein the slot of the circuit board is disposed adjacent the slot of the cover.

6. The ECU of claim 4, further comprising an adhesive-backed label disposed along the cover and covering the recess.

7. The ECU of claim 1, wherein the portion of each slot extends beyond the head of the fastener in opposite directions therefrom.

8. The ECU of claim 1, further comprising sealant material disposed over and around the fastener and covering the slot of the cover so as to provide a seal with the cover.

9. The ECU of claim 1, wherein the ECU further comprises sealant material disposed over and around the fastener and covering the slot of the cover such that the sealant and the cover seals the airflow path.

10. An electronics device, comprising:
    a circuit board having one or more electrical components disposed thereon, the circuit board including a slot defined therethrough;
    a housing in or on which the circuit board is disposed;
    a cover covering the circuit board and connected to the housing, the cover including a slot defined therethrough, the cover and the housing defining an interior space in which the circuit board is disposed; and
    a fastener attaching together the cover, the circuit board and the housing and limiting an amount of deflection of the cover relative to the housing,
    wherein the fastener, the slot of the circuit board and the slot of the cover are configured to define an airflow path between the interior space and an outer surface of the cover, and
    wherein each slot is sized and dimensioned so that the fastener is inserted therethrough, the fastener includes a head, a portion of each slot extends beyond the head of the fastener, and the airflow path is defined through the portion of each slot.

11. The electronics device of claim 10, wherein the cover includes a recess, the slot of the cover being defined in the recess.

12. The electronics device of claim 11, wherein the slot of the circuit board is disposed adjacent the slot of the cover, and the portion of each slot extends beyond the head of the fastener in opposite directions therefrom.

13. The electronics device of claim 11, further comprising an adhesive-backed label disposed along the cover and covering the recess.

14. The electronics device of claim 11, further comprising sealant material disposed over and around the fastener and covering the slot of the cover so as to provide a seal with the cover.

15. The electronics device of claim 10, further comprising sealant material disposed over and around the fastener and covering the slot of the cover such that the sealant and the cover seals the airflow path.

16. A method of assembling an electronics device, comprising:
- providing a circuit board having a slot defined therethrough, a housing, a cover having a slot defined therethrough, and a fastener;
- disposing the circuit board over or in the housing, placing the cover over the circuit board so that the circuit board is disposed within an interior spaced formed by the cover and the housing, and engaging the cover with the housing;
- inserting a fastener through the slot of the cover and the slot of the circuit board and securing the fastener to the housing, an airflow path being defined between the interior space and an outer surface of the cover through the slot of the circuit board and the slot of the cover;
- performing a leak test on the electronics device using the airflow path;
- determining whether results of the leak test indicate an absence of air leaks in the electronics device; and
- upon an affirmative determination, sealing the airflow path with a sealant.

17. The method of claim 16, wherein the cover includes a recess in which the slot of the cover is defined, the fastener is disposed in the recess, and the method further includes placing an adhesive-backed label over at least a portion of the cover, covering the recess.

* * * * *